United States Patent
Kang et al.

[11] Patent Number: 6,122,926
[45] Date of Patent: Sep. 26, 2000

[54] LOW THERMAL CONDUCTANCE INSULATED COOLING ASSEMBLY FOR IC CHIP MODULES

[75] Inventors: Sukhvinder Kang, Rochester, Minn.; Howard Victor Mahaney, Jr., Cedar Park, Tex.; Roger R. Schmidt; Prabjit Singh, both of Poughkeepsie, N.Y.

[73] Assignee: International Business Machine Corporation, Armonk, N.Y.

[21] Appl. No.: 09/415,653

[22] Filed: Oct. 12, 1999

[51] Int. Cl.[7] ..................................................... F25D 23/12
[52] U.S. Cl. .............................. 62/259.2; 62/272; 62/273
[58] Field of Search ................... 62/259.2, 272, 62/273

[56] References Cited

U.S. PATENT DOCUMENTS

| | | | |
|---|---|---|---|
| 5,028,988 | 7/1991 | Porter et al. ................................ | 357/81 |
| 5,142,443 | 8/1992 | Moore, Jr. ................................ | 361/385 |
| 5,268,812 | 12/1993 | Conte ...................................... | 361/698 |
| 5,349,823 | 9/1994 | Solomon ................................... | 62/6 |
| 5,365,749 | 11/1994 | Porter ...................................... | 62/259.2 |
| 5,463,872 | 11/1995 | Vader et al. .............................. | 62/51.1 |
| 5,504,924 | 4/1996 | Ohashi et al. ........................... | 375/800 |
| 5,918,469 | 7/1999 | Cardella .................................... | 62/3.7 |

*Primary Examiner*—William Doerrler
*Assistant Examiner*—Chen-Wen Jiang
*Attorney, Agent, or Firm*—Floyd A. Gonzales; Cantor Colburn LLP

[57] ABSTRACT

A cooling assembly for an integrated circuit (IC) chip module wherein an evaporator-cooled IC module is enclosed within an insulated housing which features a low thermal conductivity barrier between its inner and outer walls of insulation.

10 Claims, 3 Drawing Sheets

LOW THERMAL CONDUCTANCE INSULATED COOLING ASSEMBLY FOR IC CHIP MODULES

BACKGROUND OF THE INVENTION

The present invention relates to cooling technology for electronic packaging for computer systems, and, more particularly, relates to a cooling assembly for lowering the temperature of integrated circuit (IC) chip modules mounted on a printed circuit board (PCB) substrate.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chips and more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that cooling offers marked advantages in circuit speed, system throughput, and component reliability. With the advent of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequency of a CMOS processor has been improved by nearly threefold by cooling the processor to temperatures around −200° C.

Various techniques for the cooling of integrated circuit electronic devices are known and many have been implemented with success. Some practiced techniques involve conventional methods such as by directing ambient air onto the components to be cooled; by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of −40° C. to −60° C., many engineering problems must be addressed. In addition to issues involving refrigeration system design, evaporator design, and thermal controls, cooling of the electronic components to a temperature below the ambient environment dew point results in condensation problems in that moisture will condense on the cooled components and on the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which effectively and efficiently can reduce the temperature of the device to below ambient dew point without causing condensation damage to the device or contiguous components or circuitry.

SUMMARY OF THE INVENTION

Now, an improved assembly for cooling an integrated circuit (IC) device mounted on a printed circuit board (PCB) within a computer system has been developed whereby cooling of the IC device is efficiently and effectively accomplished while damaging condensation is controlled from forming on the cooled devices as well as the PCB on which the IC device is mounted and other electrical components contiguous to the cooled device. According to the present invention, a cooling assembly is provided which comprises an evaporator unit attached to the top of the hat, or cover, of an integrated chip module and in thermal communication with the hat surface. In order to maintain the reduced temperature of the cooled device and isolate the device from the ambient warm environment, the IC module and attached cooling evaporator unit are housed within an insulated enclosure which fully envelops the device and evaporator and is itself bonded around its bottom peripheral edge to the surface of the printed circuit board around the outer perimeter of the module to board interface. The enclosure includes walls fabricated from thermal insulating material. Such material comprises rigid structural foam such as polyurethane foam, expanded polystyrene, and the like, in order to provide structural integrity as well as a thermal insulative barrier. Typically, such structural foams feature thermal conductivities ranging from about 0.04 to about 0.12 W/m.° K. The preferred insulating material is rigid polyurethane foam. While it is critical to cool the IC module to low temperatures, typically in the range of about −40° C. to about −60° C., cooling to such temperatures below ambient dew point presents potential condensation problems on the cooled component as well as structures and other components attached to and around the cooled component. The described insulation helps to isolate the cooled module from the surrounding environment, but, at the low temperatures to which the module is cooled, the outer surface of the insulated enclosure may still get cool enough to result in condensation. Accordingly, in order to enhance the thermal impedance of the insulation material, according to the present invention, the thermal conductivity of the foam insulation is lowered by the provision of low thermal conductance barriers in the insulation in the walls of the enclosure between the cold interior of the enclosure and the warm outer surroundings. Such low thermal conductance barriers may be materials such as silica aerogel, low-density and low-conductivity polyurethane foams, air, and the like. Air gap barriers are preferred. For example, with air having a thermal conductivity of 0.026 W/m.° K, significant increase in the overall thermal impedance of the insulation can be achieved.

The air spaces within the insulation may be introduced in various manners and designs. For example, rigid foam castings can be molded with provisions for air spaces in the form of channels or slots. Alternatively, low thermal conductivity foams with included air pockets can be used to form the enclosure wall insulation. Such low conductivity foams include materials such as low density polyurethane foam, and the like, having thermal conductivities ranging from about 0.01 to 0.04 W/m.° K. Incorporating air spaces within the foam to increase thermal impedance, however, may impact the structural integrity of the foam. Accordingly, in a preferred embodiment, the foam wall structure is reinforced with a rigid skin over a portion or all of its outer surface. This skin typically can be metal or structural plastic. A metal material, such as steel is preferred. A preferred technique to apply a rigid skin to the foam insulation is to fit the rigid skin material to a mold as the foam material is formed, so that the reinforcing rigid skin becomes an integral part of the foam insulation skin when the cast form is removed from its mold.

The above-discussed and other features and advantages of the present invention will be appreciated and understood by those skilled in the art from the following detailed description and drawings.

BRIEF DESCRIPTION OF THE DRAWINGS

Referring now to the drawings in which like elements are numbered above in the several Figures.

DETAILED DESCRIPTION OF THE INVENTION

Figure 1:
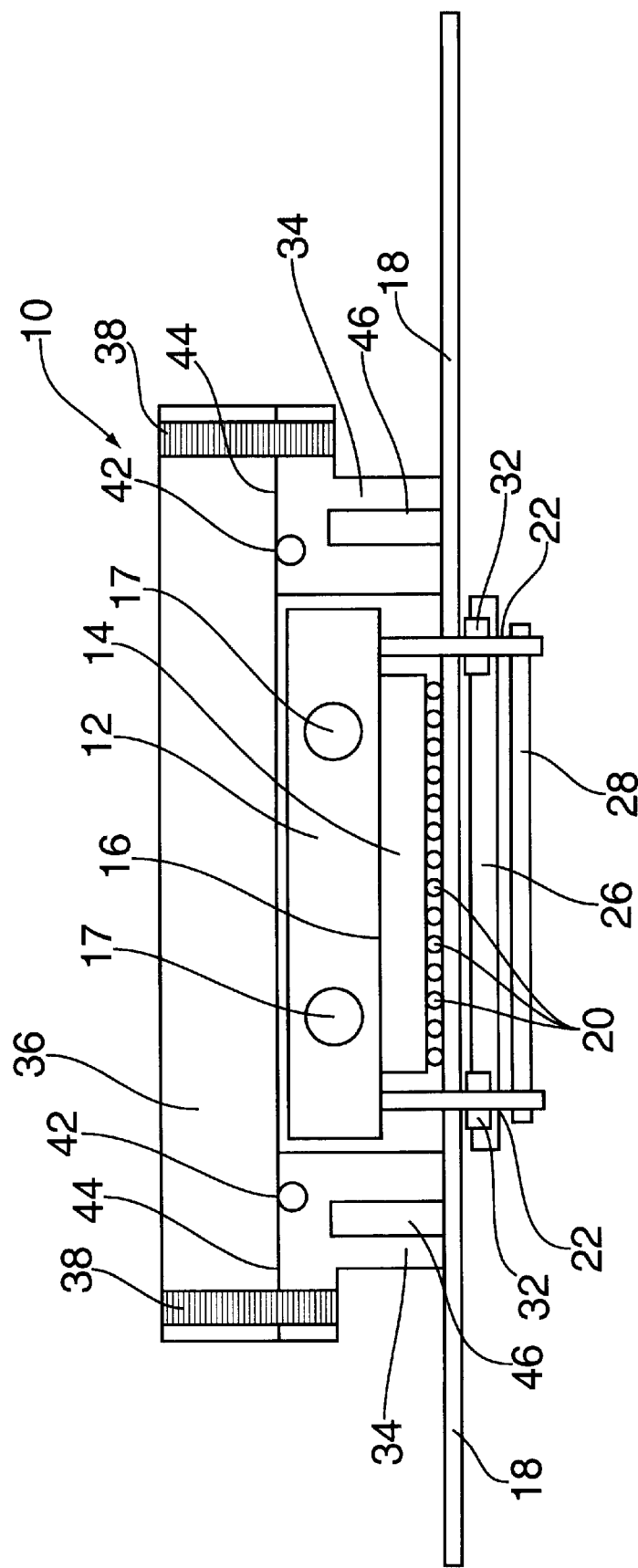
FIG. 1 is a cross sectional view illustrating an evaporator-cooled IC module showing a first embodiment of a high thermal impedance insulated enclosure.

Referring to FIG. 1, a cooling assembly 10 is shown comprising an evaporator unit 12, which is a thermal block of aluminum or copper, mounted on top of the hat, or cover, of an integrated circuit chip module 14, forming a thermal interface through conductive grease layer 16. In operation, coolant fluid from a refrigeration unit (not shown) is circulated through serpentine passages 17, bored or drilled into evaporator block 12, in a predetermined pattern. IC module 14 is in electrical communication with printed circuit board 18 via solder ball interconnects 20. The evaporator unit 12 is attached to the printed circuit board 18 by bolts 22, around its periphery, which extend from evaporator 12 and pass through printed circuit board 18 and are threaded into stiffener member 26, which serves to reinforce and stiffen the printed circuit board to prevent it from flexing under the stress of the mounted cooling assembly 10, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base member 34 and lid 36. Base 34 is made of a rigid polyurethane foam material, which preferably is formed by being molded to the appropriate shape. The bottom of enclosure base member 34 is bonded to the surface of the printed circuit board 18 through a suitable adhesive (not shown). The lid 36, which is separate and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of grease 44.

Cooling of the IC module to typical temperatures in the range of −40 to −60° C. readily could introduce condensation problems on the outer surface of the insulated housing, as well as other structures and electrical components which are nearby or to which the IC module is attached. Accordingly, it is desirable to maintain the inside of the enclosure as cold as possible, while the outside of the enclosure is maintained warm, above ambient environment dew point. The lid 36 and base 34 of the housing enclosure is made of insulating material, such as a rigid polyurethane foam. In order to increase the thermal impedance of this insulating material, a channel 46 is molded or cut into base member 34. This channel 46 extends around the entire periphery of the base 34 and provides a low thermal conductivity air space barrier to further contribute to insulating the cold enclosure from the warmer outer surface.

Figure 2:
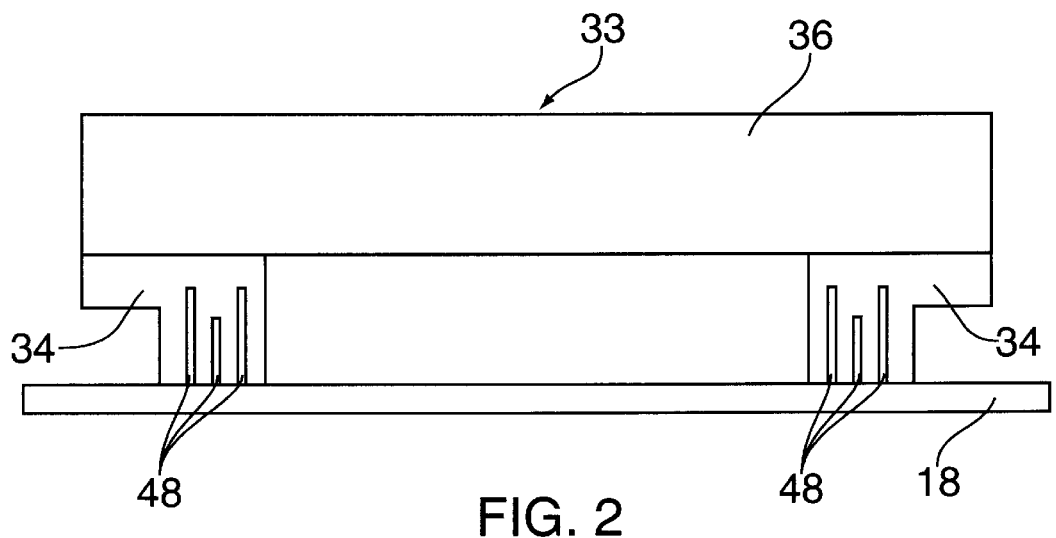
FIG. 2 is a cross sectional view of an evaporator-cooled IC module enclosure with a second embodiment of a high thermal impedance insulated enclosure.

In FIG. 2, another embodiment of an IC module enclosure is depicted, in a simplified cross-sectional side view, wherein the base 34 of the enclosure housing is fashioned to feature slots 48 which are air spaces to provide low thermal conductivity barriers within the insulation of the base member 34.

Figure 3:
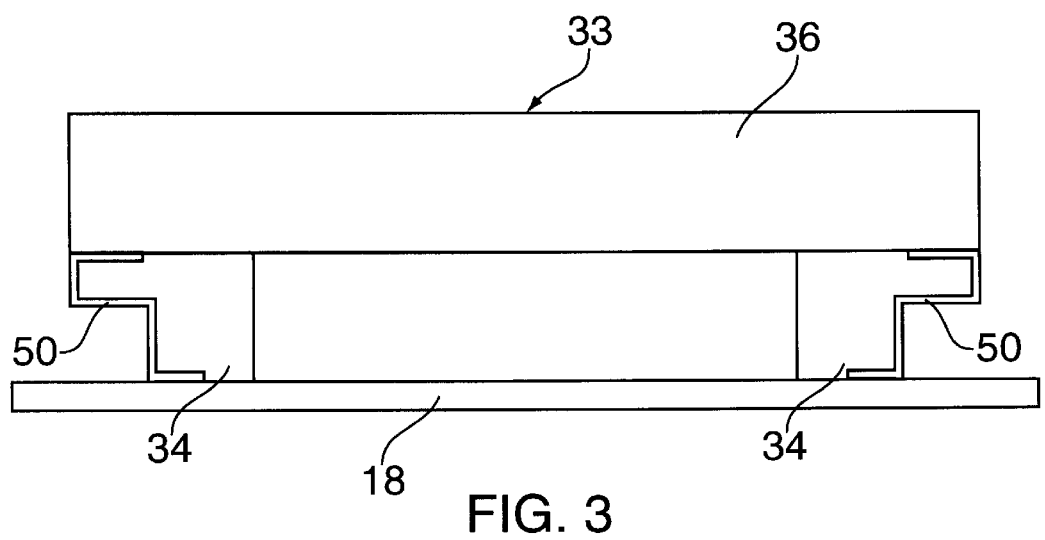
FIG. 3 is a cross sectional view of an evaporator-cooled IC module enclosure with a third embodiment of a high thermal impedance insulated enclosure.

FIG. 3 is a simplified cross-sectioned view of another IC module enclosure housing wherein the base member 34 is made from a low conductivity foam material. This foam material features increased air pockets throughout the foam material itself and this accomplishes raising the thermal impedance of the insulation. However, because of the increased air pockets in the foam, the structural integrity of the foam is compromised. To reinforce the low conductivity foam, a metal skin or mold 50 is fitted into place to support the outer surface of base member 34. This metal mold 50 extends around the entire base 34, but does not extend to the interior wall of the base 34, so as not to provide a thermal conduction path between the cooled interior of the enclosure and the warm ambient surrounding environment.

Figure 4:
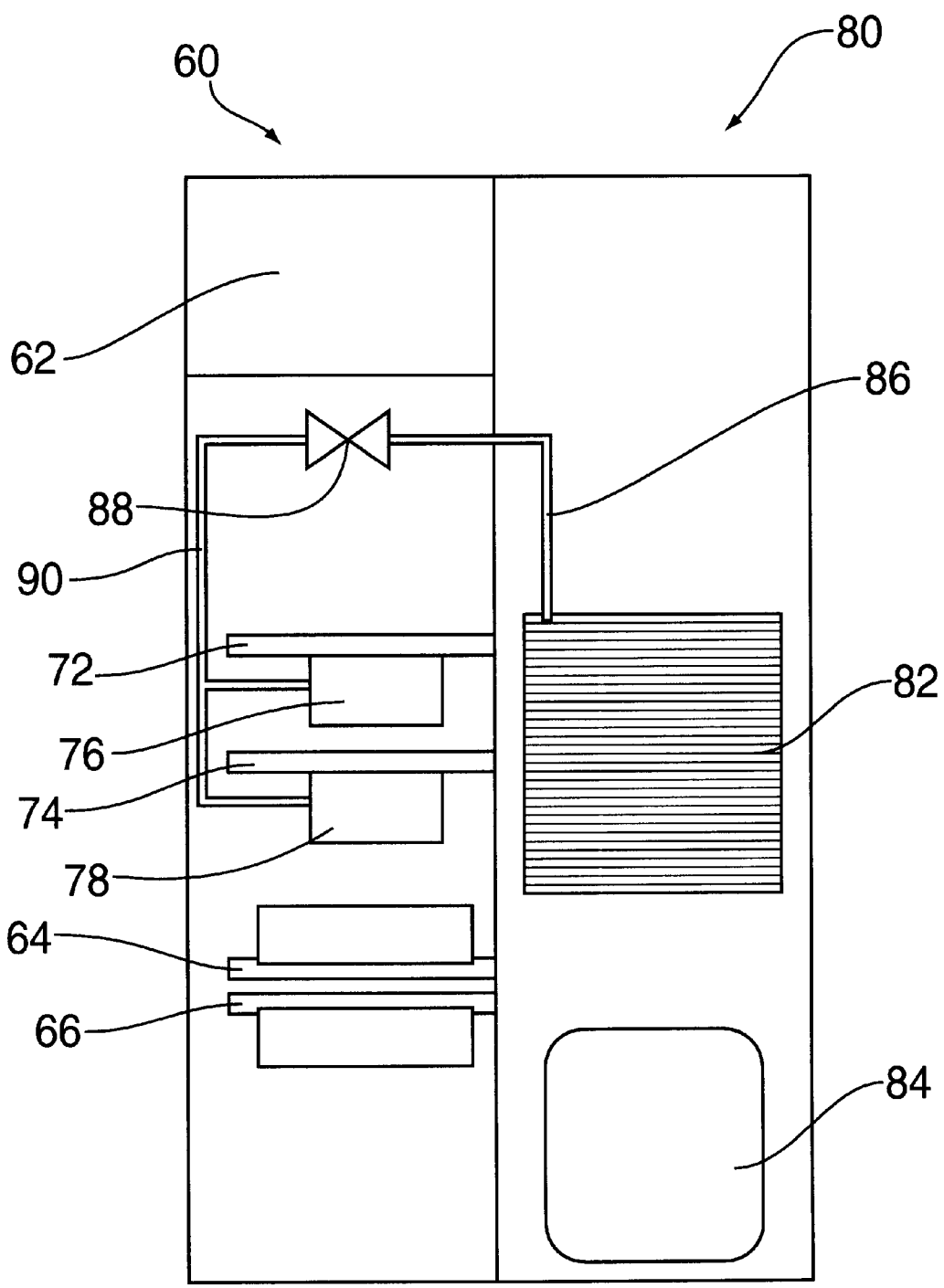
FIG. 4 is a simplified front view of depicting the arrangement of components in a typical workstation processor unit with a sidecar refrigeration system.

FIG. 4 is a simplified front view showing the arrangement of components in a typical computer workstation processor unit 60 wherein one or more integrated circuit chip modules is cooled through a refrigerated evaporator unit. The processor unit 60 consists of a power supply 62, memory cards 64 and 66, to which component modules 68 and 70 are mounted, and processor cards 72 and 74, to which evaporator cooled processor integrated chip modules enclosed within insulated housings 76 and 78 are mounted. Mated next to the processor unit 60 is sidecar refrigeration unit 80 which provides cooling for processor unit 60. Refrigeration unit 80 consists of condenser 82 and compressor 84, interconnected with appropriate hosing and conduits (not shown) and connected through flexible refrigerant line 86 with quick connect coupling 88 to refrigerant distribution hose 90.

Distribution hose 90 conducts coolant to the evaporator blocks within insulated housings 76 and 78 to cool the enclosed IC modules.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling assembly for an integrated circuit chip module mounted on aprinted circuit board substrate comprising:
   - an evaporator unit having a thermal interface in thermal communication with said integrated circuit chip module so as to cool said module to a temperature below ambient dew point; and,
   - an insulated housing having its base attached to said printed circuit board substrate and surrounding the outer perimeter of said integrated circuit module so as to enclose said evaporator unit and said integrated circuit module, said housing having walls of a solid foam insulation material having a gap of thermal barrier material interposed between the inner surface of the walls and the outer surface of the walls to interrupt the thermal conduction path through the insulation material.

2. The cooling assembly of claim 1 wherein the thermal barrier material is selected from the group consisting of silica aerogel, low density and low conductivity polyurethane foam, and air.

3. The cooling assembly of claim 2 wherein the thermal barrier material is air.

4. The cooling assembly of claim 3 wherein the gap of thermal barrier material is in the form of a channel through the insulated housing.

5. The cooling assembly of claim 3 wherein the gap of thermal barrier material are pockets of air dispersed throughout the foam insulation.

6. The cooling assembly of claim 5 wherein the foam insulation material is a low density, low conductivity polyurethane foam, having a thermal conductivity ranging from about 0.01 to about 0.04 W/m.° K.

7. The cooling assembly of claim 6 wherein the foam insulation is a low conductivity polyurethane foam.

8. The cooling assembly of claim 7 wherein the low conductivity polyurethane foam is reinforced with a rigid skin.

9. The cooling assembly of claim 8 wherein the rigid skin is metal which forms an integral part of the low conductivity polyurethane foam which is molded therein.

10. A cooling assembly for an integrated circuit chip module mounted on a printed circuit board substrate comprising:
    - an evaporator unit having a thermal interface in thermal communication with said integrated circuit chip module so as to cool said module to a temperature below ambient dew point; and,
    - an insulated housing having its base attached to said printed circuit board substrate and surrounding the outer perimeter of said integrated circuit module so as to enclose said evaporator unit and said integrated circuit module, said housing having walls of a solid polyurethane foam insulation material with a thermal conductance ranging from about 0.04 to about 0.12 W/m.° K, and having channels of air interposed between the inner surface of the walls and the outer surface of the walls to interrupt the thermal conduction path through the insulation material.

* * * * *